(12) United States Patent
Ito et al.

(10) Patent No.: US 6,865,201 B2
(45) Date of Patent: Mar. 8, 2005

(54) SEMICONDUCTOR LASER DEVICE, METHOD OF FABRICATING THE SAME AND OPTICAL INFORMATION REPRODUCTION APPARATUS

(75) Inventors: Shigetoshi Ito, Ikoma (JP); Yukio Yamasaki, Daito (JP); Toshiyuki Kawakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/104,931

(22) Filed: Mar. 22, 2002

(65) Prior Publication Data

US 2002/0141468 A1 Oct. 3, 2002

(30) Foreign Application Priority Data

Mar. 23, 2001 (JP) ........................................ 2001-085248

(51) Int. Cl.⁷ .............................. H01S 5/00; H01L 21/00
(52) U.S. Cl. .......................................... 372/45; 438/22
(58) Field of Search ............................ 372/45; 257/90, 257/99, 107; 438/22, 46

(56) References Cited

U.S. PATENT DOCUMENTS

| | | | | |
|---|---|---|---|---|
| 5,753,966 A | * | 5/1998 | Morita et al. | 257/627 |
| 6,238,945 B1 | * | 5/2001 | Kaneko | 438/46 |
| 6,265,726 B1 | * | 7/2001 | Manabe et al. | 257/13 |
| 6,274,399 B1 | * | 8/2001 | Kern et al. | 438/22 |
| 6,515,313 B1 | * | 2/2003 | Ibbetson et al. | 257/103 |
| 2001/0042866 A1 | * | 11/2001 | Coman et al. | 257/103 |
| 2002/0096687 A1 | * | 7/2002 | Kuo et al. | 257/99 |
| 2002/0179914 A1 | * | 12/2002 | Sheu | 257/90 |
| 2003/0122147 A1 | * | 7/2003 | Sheu | 257/90 |

OTHER PUBLICATIONS

Masaru Kuramoto et al. (1999) Jpn. J. Appl. Phys. vol. 38 "Room–Temperature Continuous–Wave Operation of InGaN Multi–Quantum–Well Laser Diodes Grown on an n–GaN Substrate with backside n–Contact" pp. L184–L186 no month.

* cited by examiner

Primary Examiner—Don Wong
Assistant Examiner—Hung T Vy
(74) Attorney, Agent, or Firm—Morrison & Foerster LLP

(57) ABSTRACT

In connection with a nitride semiconductor laser device optimal for example for optical pickup and an optical information reproduction apparatus having superior condensation characteristics, the semiconductor laser device includes a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon having a lattice constant larger than the substrate of nitride semiconductor, and the device is cleaved and thus divided to have a surface serving as a resonator mirror.

9 Claims, 10 Drawing Sheets

SEMICONDUCTOR LASER DEVICE, METHOD OF FABRICATING THE SAME AND OPTICAL INFORMATION REPRODUCTION APPARATUS

BACKGROUND OF THE INVENTION

1. Field of the Invention

The present invention relates generally to semiconductor laser devices using gallium nitride-based semiconductor and optical information reproduction apparatuses using the semiconductor laser device as a source of light, and particularly to an improvement in the device's end surface mirror.

2. Description of the Related Art

Nitride based semiconductor materials represented by GaN, InN, AlN and mix crystal semiconductor thereof are used to build a prototype of a semiconductor laser device emitting light in a range from blue color through ultraviolet. FIG. 10 shows a nitride semiconductor laser device lasing with a wavelength of 405 nm, as reported by Masaru KURAMOTO et al., *Japanese Journal of Applied Physics*, vol. 38, pp. L184–L186, 1999. This semiconductor laser device includes a substrate 901 of n-GaN (of 100 $\mu$m in thickness) and thereon a lower clad layer 902 of n-$Al_{0.07}Ga_{0.93}N$ (of 1 $\mu$m in thickness), a lower guide layer 903 of n-GaN (of 0.1 $\mu$m in thickness), a triple quantum well active layer 904 of $In_{0.2}Ga_{0.8}N$ (of 3 nm in thickness) /$In_{0.05}Ga_{0.95}N$ (of 5 nm in thickness), a cap layer 905 of p-$Al_{0.19}Ga_{0.81}N$ (of 20 nm in thickness), an upper guide layer 906 of p-GaN (of 0.1 $\mu$m in thickness), an upper clad layer 907 of p-$Al_{0.07}Ga_{0.93}N$ (of 0.5 $\mu$m in thickness) and a contact layer 908 of p-GaN (of 0.05 $\mu$m in thickness), successively stacked, with an electrode 909 provided thereon and thereunder. Furthermore, an end surface mirror is provided by cleavage. This laser device has active and guide layers posed between clad layers to have a waveguide structure. The active layer emits light, which is in turn confined in this waveguide structure, and the end surface mirror functions as laser resonator mirror to provide a lasing operation.

This conventional semiconductor laser device as described above, however, is disadvantageous, as follows: the present inventors fabricated a semiconductor laser device having the aforementioned structure and have found that in a waveguide portion at an end surface mirror an epitaxially grown layer (each semiconductor layer upper than substrate 901) can have a cross section, a region in a vicinity of a front surface (i.e., a surface opposite to the substrate) in particular, failing to have a satisfactory cleavage plane. Herein an "unsatisfactory cleavage plane" means that an epitaxially grown layer forming a waveguide has a step offset from a vertical cross section or there exists a plane different in angle from a cleavage plane of the GaN substrate or there exists a rolling portion. The present inventors observed this portion in detail and have found that in particular at the active layer, cracking varies, and from the active layer through the front surface, the cracking is often observed different than in the remainder.

A semiconductor laser device has an end surface mirror provided by externally exerting a force along a scratch on a wafer to warp and thus divide the wafer at a predetermined position. As such, the wafer particularly has a surface and therearound receiving a large magnitude of force exerted thereto and thus considered as cracking in a more complicated manner than the interior of the wafer. Possibly for the aforementioned semiconductor based semiconductor laser device this issue was not noted in designing the structure of a layer provided in a vicinity of an active layer formed in a vicinity of the wafer surface and it is thus believed that cracking tends to vary at the active layer of InGaN.

The conventional technology can thus fail to provide a satisfactory end surface mirror. Thus not only does mirror reflectance variation vary a threshold value, differential efficiency and other similar device characteristics but also a light radiation surface roughened prevents a far field pattern (FFP) from being smoothly unimodal, and a split peek, ripple or other impaired optical characteristics would be introduced. Such a FFP abnormality is not preferable as it results in insufficiently condensed light in application for example to an optical pickup in particular and in an extreme case causes stray light.

SUMMARY OF THE INVENTION

The present invention contemplates a nitride semiconductor laser device optimal for application for example to optical pickup and also contemplates an optical information reproduction apparatus implemented with superior condensation characteristics.

The present invention provides a semiconductor laser device including a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a lattice constant larger than the substrate of nitride semiconductor, wherein the device is cleaved and thus divided to have a surface serving as a resonator mirror.

Preferably the contact layer of $Al_aIn_bGa_{1-a-b}N$ is larger in lattice constant than the substrate of nitride semiconductor by 0.4 to 6%. Furthermore, preferably the substrate of nitride semiconductor is formed of GaN and the contact layer of $Al_aIn_bGa_{1-a-b}N$ has a composition with a=0 and $0.05 \leq b \leq 0.3$. Furthermore, preferably the contact layer of $Al_aIn_bGa_{1-a-b}N$ is no less than 20 nm in thickness and preferably a thickness of 50 to 200 $\mu$m is provided as measured from the substrate of nitride semiconductor to the contact layer of $Al_aIn_bGa_{1-a-b}N$.

The present invention provides a method of fabricating a semiconductor laser device, including the steps of: providing a groove on a surface of a stacked layer of a wafer formed of a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a lattice constant larger than the substrate of nitride semiconductor; and externally exerting a force to warp the wafer to allow a grooved side thereof to protrude to provide a cleavage plane along the groove.

The present invention provides an optical information reproduction apparatus condensing a laser beam of light to illuminate an optical information recording medium therewith and detecting a light reflected from the optical information recording medium to reproduce information recorded on the optical information recording medium, wherein the semiconductor laser device as described above or a semiconductor laser device fabricated in the method as described above is used as a source of light.

In accordance with the present invention a semiconductor laser device formed of a nitride semiconductor material can provide a far field pattern which is unimodal and free of significant ripple and have superior optical characteristics.

Furthermore, using such a semiconductor laser device allows an optical information reproduction apparatus to be implemented to be capable of condensing light at high resolution and reading an optical disk having information densely recorded therein.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Semiconductor Laser Device

Figure 1:
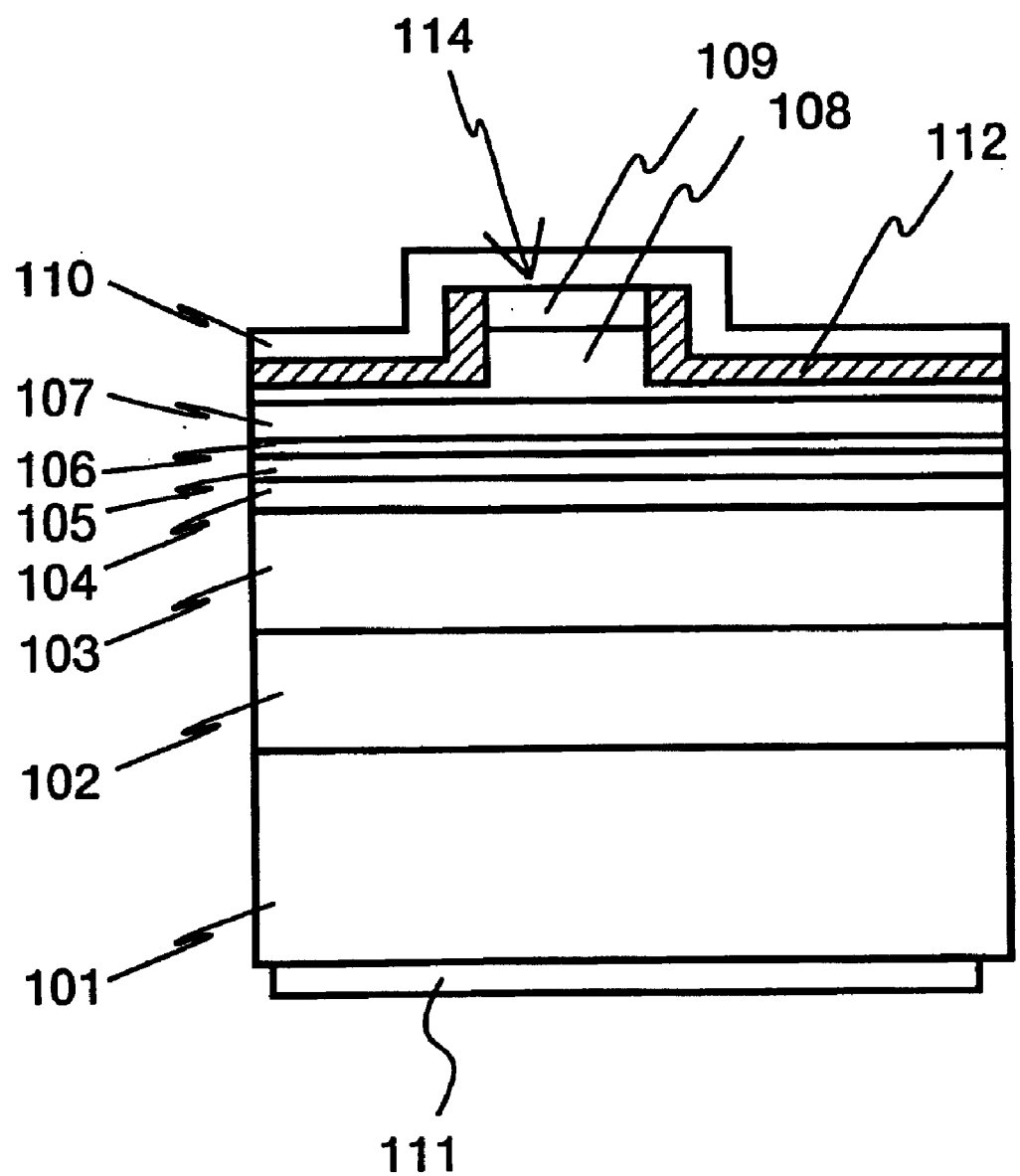
FIG. 1 shows a semiconductor laser device of the present invention.

The present invention provides a semiconductor laser device characterized in that on a nitride semiconductor substrate there are stacked a lower clad layer of nitride semiconductor, an active layer, an upper clad layer of nitride semiconductor and a contact layer of $Al_aIn_bGa_{1-a-b}N$ having a larger lattice constant than the nitride semiconductor substrate and the device is cleaved and thus divided to have a surface serving as a resonator mirror.

Herein nitride semiconductor refers to a compound semiconductor formed mainly of a group III element and the element N and it includes $Al_xIn_yGa_{1-x-y}N$, wherein $0 \leq x$, $y \leq 1$, as well as a crystal with its group III element having a portion (no more than approximately 20%) substituted with B, Tl or any other similar group III element and a crystal with its element N having a portion (no more than approximately 10%) substituted with As, P, Sb or any other similar group V element. The nitride semiconductor substrate is preferably formed of a 2-element compound as such would eliminate deviation in composition, distribution and the like and thus provide steady quality. To do so a substrate of GaN is preferably used.

The contact layer of $Al_aIn_bGa_{1-a-b}N$ is required to have a lattice constant larger than the nitride semiconductor substrate. Otherwise, a satisfactory cleavage plane would not be obtained and an abnormal horizontal FFP would be introduced. The contact layer of $Al_aIn_bGa_{1-a-b}N$ having a composition larger in lattice constant than GaN serving as a substrate allows satisfactory cleavage if the clad layer is formed of a material smaller in lattice constant than the substrate. Preferably, the contact layer of $Al_aIn_bGa_{1-a-b}N$ has a lattice constant 0.4 to 6% larger than the nitride semiconductor substrate, as such can prevent a FFP abnormality attributed for example to unevenness introduced on an end surface mirror.

If a structure formed of layers of nitride-based semiconductor stacked on a substrate is cleaved along a (10—10) plane, the nitride based semiconductor laser device of the present embodiment and that of the conventional example are considered as being disadvantageous, as follows: the structure formed of stacked layers includes a layer, such as a clad layer of AlGaN, formed of a material different in lattice constant from the substrate and this layer internally has a distortion attributed to lattice mismatch. It is thus believed that the structure cleaved tends to have an uneven cleavage plane and can thus hardly be perfectly flat. Furthermore, a nitride based semiconductor is hexagonal and a cleavage plane exists for every 60° degrees. As such in cleavage to provide a laser bar it cracks obliquely and the cleavage line is offset and the bar thus hardly has a uniform width. This means that a steady cleavage plane is hardly obtained and it can thus also be understood that on a cleavage plane unevenness is readily introduced. In particular, unevenness is readily introduced in a vicinity of a surface at which the force exerted to provide a cleavage concentrates. The present invention provides satisfactory cleavage possibly because at least a waveguide portion (a striped portion) has an outermost surface provided with a crystal larger in lattice constant than the substrate while the clad layer is provided with that smaller in lattice constant than the substrate, and a force applied on a cross section to provide a cleavage is thus exerted differently than conventional.

If the nitride semiconductor substrate is GaN, the contact layer of $Al_aIn_bGa_{1-a-b}N$ preferably has a composition with $a=0$ and $0.05 \leq b \leq 0.3$. $a=0$ is preferable, as the inclusion of In allows the contact layer to have a larger crystal lattice constant than the substrate and the inclusion of Al does not allow a composition to be readily controlled and also tends to provide an increased electrode contact resistance. $b<0.05$ would prevent the substrate and the contact layer from having a sufficient difference in lattice constant therebetween and the present invention thus cannot sufficiently be effective. $b>0.3$ would result in the substrate and the contact layer having too large a difference in lattice constant therebetween to obtain a crystal having a sufficient quality for the contact layer to be formed, and provide an excessively increased electrode contact resistance.

The contact layer of $Al_aIn_bGa_{1-a-b}N$ preferably has a thickness of no less than 20 nm. If it has a thickness less than 20 nm it hardly provides a satisfactory cleavage plane.

The contact layer can alternatively have a superlattice structure formed of a plurality of layers each having a thickness of no more than 10 nm. For example, the contact layer can be a superlattice structure formed of a periodical structure (of 15 periods) of $p-In_{0.2}Ga_{0.8}N$ (of 6 nm in thickness) /p-GaN (of 6 nm in thickness). In this example, a crystal's composition may be considered on average and such an averaged composition is measurable through X-ray diffraction.

The substrate preferably has a thickness of no less than 30 $\mu m$. The substrate of less than 30 $\mu m$ in thickness hardly provides a satisfactory cleavage plane.

As measured from the nitride semiconductor substrate to the contact layer of $Al_aIn_bGa_{1-a-b}N$ cleaved, a thickness of 50 to 200 μm is preferable and a thickness of 80 to 160 μm is more preferable. If the thickness is less than 50 μm, a blade applied to the wafer would crack the wafer at a location other than required. If the thickness is larger than 200 μm an excessively large external force needs to be applied thereto to crack it. This results in an obliquely offset cleavage line and a bar varying in width and thus hardly provides a resonator length, as required.

The present semiconductor laser device has a specific configuration, as will now be described with reference to a schematic diagram provided in FIG. 7, although it is not limited thereto.

The present semiconductor laser device is formed of a substrate 501 of n-$Al_mIn_nGa_{1-m-n}N$ and 30 to 200 μm in thickness, wherein $0 \leq m$, $0 \leq n < 1$, $m+n \leq 1$, and on this substrate an intermediate layer 502 of n-$Al_iGa_{1-i}N$ and 0 to 30 μm in thickness, wherein $0 \leq i \leq 0.2$, an intermediate layer 512 of n-$In_cGa_{1-c}N$ and 0 to 0.2 μm in thickness, wherein $0 \leq c \leq 0.2$, a lower clad layer 503 of n-$Al_{x1}Ga_{1-x1}N$ and 0.4 to 10 μm in thickness, wherein $0.05 \leq x1 \leq 0.3$, a lower guide layer 504 of $In_{y1}Ga_{1-y1}N$ and 0 to 0.3 μm in thickness, wherein $0 \leq y1 \leq w$, a quantum well active layer 505 formed of $In_wGa_{1-w}N$ well and $In_vGa_{1-v}N$ barrier layers alternating to provide a multi-layer structure, and having a light emission wavelength of 370 to 450 nm and a total thickness of 3 to 200 nm, wherein $v < w$, a cap layer 506 of $Al_zGa_{1-z}N$ and 0 to 50 nm in thickness, wherein $0 \leq z \leq 0.3$, an upper guide layer 507 of $In_{y2}Ga_{1-y2}N$ and 0 to 0.3 μm in thickness, wherein $0 \leq y2 \leq w$, a saturable absorption layer 513 of p-InGaN and 0 to 50 nm in thickness, an upper clad layer 508 of p-$Al_{x2}Ga_{1-x2}N$ and 0.4 to 10 μm in thickness, wherein $0.05 \leq x2 \leq 0.2$, and a contact layer 509 of p-$Al_aIn_bGa_{1-a-b}N$ and 5 nm to 50 μm in thickness, wherein $0 \leq a < 1$, $0 \leq b$, $a+b \leq 1$, and having a larger lattice constant than the substrate's crystal, successively stacked on the substrate. In the present invention, contact layer 509 can have a lattice constant larger than substrate 501 to provide a satisfactory cleavage plane. a wafer, as measured from substrate 501 to contact layer 509 formed thereon, has a thickness of 50 to 200 μm. Furthermore, contact layer 509 has an upper surface provided with an electrode 510 (for example a metal including any of Co, Ni, Cu, Pd, Ag, Ir, Pt, Au, Sc, Ti, V, Cr, Y, Zr, Nb, Mo, La, Hf, Ta, W, Al, Tl) and substrate 501 has a back surface provided with an electrode 511 (for example a metal including any of Co, Ni, Cu, Pd, Ag, Ir, Pt, Au, Sc, Ti, V, Cr, Y, Zr, Nb, Mo, La, Hf, Ta, W, Al, Tl). Although not shown in the figure, the present semiconductor laser device has a flat laser resonator mirror provided by a surface of the device that is provided by cleaving a semiconductor crystal and thus dividing the device.

Intermediate layers 502 and 512 are inserted under lower clad layer 503 to also prevent the structure of stacked layers from cracking.

Lower guide layer 504 is posed between lower clad layer 503 and active layer 505 and it is a layer smaller in energy bandgap than the lower clad layer. It is not a requirement that lower guide layer 504 be a single layer, and it may be a thin InGaN film of approximately two to five layers different in composition ratio, a structure formed of stacked layers of thin films of GaN and AlGaInNPAs, or a superlattice, stacked-layer structure formed of a large number of thin films. In such an example, a composition weighted-averaged by the thickness of each thin film is applied as that of lower guide layer 504.

Similarly, upper guide layer 507 is posed between upper clad layer 508 and active layer 505 and it is a layer smaller in energy bandgap than the upper clad layer. It is not a requirement that upper guide layer 507 be a single layer, and it may be a thin InGaN film of approximately two to five layers different in composition ratio, a structure formed of stacked layers of thin films of GaN and AlGaInNPAs, or a superlattice, stacked-layer structure formed of a large number of thin films. In such an example, a composition weighted-averaged by the thickness of each thin film is applied as that of the upper guide layer, as has been described above for the lower guide layer.

The lower and upper guide layers associated with an energy bandgap decreased as they approach the active layer, or GRIN-SCH, allow light to be confined to the active layer more effectively to contribute to reduced threshold value.

Saturable absorption layer 513 is posed on upper guide layer 507 and provides saturable absorption effect to more readily provide self-excited oscillation when the device lases.

The present semiconductor laser device has another configuration, as will now be described with reference to FIG. 8.

This semiconductor laser device includes a substrate 601 of n-$Al_mIn_nGa_{1-m-n}N$ and 30 to 200 μm in thickness, wherein $0 \leq m$, $0 \leq n < 1$, $m+n \leq 1$, and on the substrate an intermediate layer 602 of n-AlGaInPAs and 0 to 30 μm in thickness, a lower clad layer 603 of n-AlGaInPAs with an energy bandgap $E_a[eV]$ and 0.4 to 10 μm in thickness, a lower guide layer 604 of AlGaInNPAs with an energy bandgap $E_1[eV]$ and 0 to 0.3 μm in thickness, wherein $E_1 < E_a$, a quantum well active layer 605 formed of AlGaInNPAs well and barrier layers alternating to provide a multi-layer structure, and having a light emission wavelength of 300 to 800 nm and a total thickness of 3 to 200 nm, a cap layer 606 of AlGaInNPAs with an energy bandgap $E_c[eV]$ and 0 to 100 nm in thickness, wherein $E_c > E_2$, an upper guide layer 607 of AlGaInNPAs with an energy bandgap $E_2[eV]$ and 0 to 0.3 μm in thickness, wherein $E_2 < E_b$, an upper clad layer 608 of p-AlGaInNPAs with an energy bandgap $E_b[eV]$ and 0.3 to 10 μm in thickness, and a contact layer 609 of p-$Al_aIn_bGa_{1-a-b}N$ and 5 nm to 50 μm in thickness and having a larger lattice constant than the substrate's crystal, wherein $0 \leq a < 1$, $0 \leq b$, $a+b \leq 1$. In the present invention, contact layer 609 can have a lattice constant larger than substrate 601 to provide a satisfactory cleavage plane. A wafer, as measured from substrate 601 to contact layer 609 formed thereon, has a thickness of 50 to 200 μm. Furthermore, contact layer 609 has an upper surface provided with an electrode 610 (for example a metal including any of Co, Ni, Cu, Pd, Ag, Ir, Pt, Au, Sc, Ti, V, Cr, Y, Zr, Nb, Mo, La, Hf, Ta, W, Al, Tl) and substrate 601 has a back surface provided with an electrode 611 (for example a metal including any of Co, Ni, Cu, Pd, Ag, Ir, Pt, Au, Sc, Ti, V, Cr, Y, Zr, Nb, Mo, La, Hf, Ta, W, Al, Tl). Although not shown in the figure, the present semiconductor laser device has a flat laser resonator mirror provided by a surface of the device that is provided by cleaving a semiconductor crystal and thus dividing the device.

Method of Fabricating Semiconductor Laser Device

The present invention provides a method of fabricating a semiconductor laser device including the steps of: providing a groove on a surface of a stacked layer of a wafer formed of a substrate of nitride semiconductor, and thereon a lower clad layer of nitride semiconductor, an active layer, an upper clad layer of nitride semiconductor and a contact layer of $Al_aIn_bGa_{1-a-b}N$ having a lattice constant larger than the substrate, stacked on the substrate; and externally exerting a force to warp the wafer to allow a grooved side thereof to protrude to provide a cleavage plane along the groove.

In the present invention a wafer has a stacked layer grooved. If a wafer has a substrate grooved it would provide a smaller yield thereof providing a satisfactory cleavage plane than that having a stacked layer grooved In the present invention an external force is applied to warp and thus allow the grooved stacked layer to protrude to provide a cleavage plane. Warping and thus allowing a groove-free substrate to protrude to provide a cleavage plane results in a reduced yield providing a satisfactory cleavage plane.

In providing the groove, a striped geometry defining a waveguide of laser light is avoided to allow the striped geometry to have an end surface having a satisfactory cleavage plane. The groove can be formed only at an edge of a wafer or it can be provided in a broken line avoiding the striped geometry. To obtain a further satisfactory cleavage plane the wafer is preferably adjusted to have a thickness of approximately 50 to 200 $\mu$m.

Optical Information Reproduction Apparatus

The present invention provides an optical information reproduction apparatus condensing and thus directing a laser beam of light to an optical information recording medium having information recorded therein, and detecting light reflected by the medium to reproduce information recorded in the medium, characterized in that it uses as a source of light the above-described semiconductor laser device or a semiconductor laser device fabricated by the above-described semiconductor laser fabrication method.

Using a semiconductor laser device with superior optical characteristics that has a far field pattern unimodal and free of significant ripple, allows an optical information reproduction apparatus to be capable of condensing light with high resolution and reading information from an optical recording medium such as an optical disk having the information densely recorded thereon.

First Embodiment

FIG. 1 is a cross section of a semiconductor laser device of a first embodiment. This semiconductor laser device includes a substrate 101 of n-GaN and 100 $\mu$m in thickness, and thereon an intermediate layer 102 of n-GaN and 3 $\mu$m in thickness, a lower clad layer 103 of n-$Al_{x1}Ga_{1-x1}N$ and 1.2 $\mu$m in thickness, wherein x1=0.1, a lower guide layer 104 of n-GaN and 0.1 $\mu$m in thickness, a triple quantum well active layer 105 formed of a well layer of $In_wGa_{1-w}N$, wherein 0<w<1, and a barrier layer of $In_vGa_{1-v}N$, wherein 0≦v<w, alternating to provide a multi-layer structure, and having a light emission wavelength of 400 nm and a total thickness of 40 nm, a cap layer 106 of AlGaN and 20 nm in thickness, an upper guide layer 107 of p-GaN and 0.1 $\mu$m in thickness, an upper clad layer 108 of p-$Al_{x2}Ga_{1-x2}N$ and 0.4 $\mu$m in thickness, wherein x2=0.1, and a contact layer 109 of p-$Al_aIn_bGa_{1-a-b}N$ and 0.03 $\mu$m in thickness and having a lattice constant larger than the substrate, wherein a=0 and b=0.1, each being a nitride based semiconductor layer. Contact layer 109 has an upper surface provided with a metal electrode 110 and substrate 101 has a back surface provided with a metal electrode 111. A portion of upper clad layer 108 and contact layer 109 are ridged to have a striped geometry to provide a semiconductor laser's lateral light confinement configuration. Furthermore, metal electrode 110 contacts the semiconductor layer only at a ridged, striped portion 114 and the remainder thereof is prevented by an interposed insulation film 112 from contacting the semiconductor layer (upper clad layer 108). Thus only the ridged, striped portion passes an electric current to also implement a portion narrowing the electric current. To provide n-type semiconductor, Si, Ge, O, S, Se are preferably used as dopant. To provide p-semiconductor, Be, Cd, Mg are preferably used as dopant. Adding any of Si, Ge, O, S, Se together with Be, Cd, Mg simultaneously is also preferable as such can provide a p-type layer providing low resistance and small dopant diffusion. The present semiconductor laser device has a flat laser resonator mirror provided by a surface of the device that is provided by cleaving a semiconductor crystal and thus dividing the device.

Reference will now be made to FIG. 1 to describe a method of fabricating a semiconductor laser device in the present embodiment.

Initially, on substrate 101 of n-GaN with a (0001) plane served for crystal growth, intermediate layer 102 of n-GaN, a lower clad layer 103 of n-$Al_{x1}Ga_{1-x1}N$, wherein x1=0.1, lower guide layer 104 of n-GaN, triple quantum well active layer 105 formed of a well layer of $In_wGa_{1-w}N$, wherein 0<w<1, and a barrier layer of $In_vGa_{1-v}N$, wherein 0≦v<w, stacked alternately to provide a multi-layer structure, cap layer 106 of AlGaN, upper guide layer 107 of p-GaN, upper clad layer 108 of p-$Al_{x2}Ga_{1-x2}N$, wherein x2=0.1, and contact layer 109 of p-$Al_aIn_bGa_{1-a-b}N$ are successively stacked through organometallic chemical vapor deposition (OMCVD). Upper clad layer 108 and contact layer 109 are then etched away to leave a stripe of 2 $\mu$m in width to provide a ridged stripe 114 as shown in FIG. 1. A portion other than the stripe is then covered with insulation film 112 for example of $SiO_2$ or $Al_2O_3$, $ZrO_2$, $TaO_2$, $TiO_2$, AlN, AlGaN and an upper surface is thereafter provided with metal electrode 110. Metal electrode 110 may be of any of Pd/Au, Ni/Pd/Au, Pd/Pt/Au, Pd/Mo/Au, and Pd/W/Au and it is only required to have a total thickness of approximately 0.05 to 3 $\mu$m. Substrate 101 has a back surface polished to adjust the wafer in thickness. To facilitate obtaining a satisfactorily cleaved end surface, the wafer is preferably adjusted to have a thickness of 50 to 200 $\mu$m and in the present embodiment it had a thickness of 90 $\mu$m. Then the substrate is provided on a back surface thereof with metal electrode 111. Metal electrode 111 may be of any of Ti/Al, Zr/Al, Hf/Al and W/Al and it is only required to have a total thickness of approximately 0.05 to 3 $\mu$m. Furthermore, metal electrode 111 may be covered and Mo/Au, Mo/Ni, W/Au, Cr/Ni or any other similar structure formed of stacked layers may be provided to facilitate wire-bonding or die-bonding.

Figure 2:
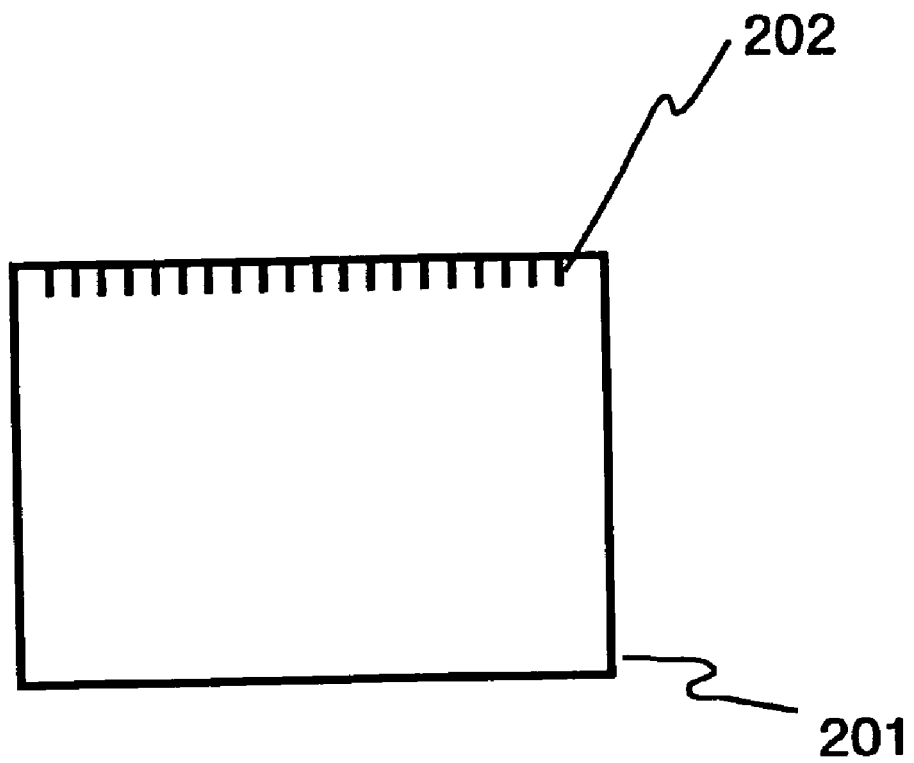
FIG. 2 shows a method of fabricating the semiconductor laser device of the present invention.

Then the following process is followed to cleave the wafer to provide an end surface mirror. This process will be described with reference to FIG. 2. FIG. 2 shows the wafer, as seen downward. Wafer 201 obtained through the above-described process has a front surface (a surface of a stacked layer) scribed to provide the wafer at an end thereof with a groove 202 of approximately 1 mm in length. In this step, a diamond needle is used to scribe a surface of the wafer to provide a scratch. It should be noted that groove 202 is provided in a direction parallel to a (10—10) plane, a cleavage plane of a GaN crystal, and ridged stripe 114 has a direction previously set to allow this cleavage plane to be orthogonal to ridged stripe 114. While in the present embodiment groove 202 is provided on wafer 201 at an end thereof, as has been described above, there may be provided more than one such groove along a line for cleavage. Providing more than one such groove can prevent the line for cleavage from being offset obliquely.

Then along groove 202 a blade is applied to the wafer on n-GaN substrate 101 (the back surface) to apply external force thereto, i.e., to apply external force to warp and thus allow the wafer's grooved side to protrude to divide the wafer from the groove. As a result, a GaN crystal's cleavage or (10—10) plane appeared as a cleavage cross section. This plane is orthogonal to ridged stripe 114 and functions as a laser waveguide's end surface mirror. Wafer 201 thus provided a large number of laser bars with a lateral series of individual laser devices. The process as described above is preferable, since warping wafer to allow the substrate to protrude to provide a cleavage hardly provides a satisfactory end surface. The groove may be provided to a wafer on the back surface, although providing the groove, as described in the present embodiment, has been found to provide a higher yield providing a satisfactory end surface.

The bar is then scribed, diced or similarly divided to cut the series of laser devices off the bar, as appropriate, to provide individual semiconductor laser devices (or chips). The obtained semiconductor laser device is placed on a stem, a lead frame or any other similar base with metal electrode 110 facing downward and metal electrode 111 wired or metal electrode 111 facing downward and metal electrode 110 wired to externally supply it with power to operate it.

In the semiconductor laser device of the present embodiment, contact layer 109 of p-$Al_aIn_bGa_{1-a-b}N$ on upper clad layer 108 of p-$Al_{x2}Ga_{1-x2}N$ and 0.4 $\mu$m in thickness, wherein x2=0.1, stacked on the GaN substrate has a composition with a lattice constant larger than GaN serving as the substrate. As such, if upper clad layer 108 is formed of a material smaller in lattice constant than the substrate, a satisfactory cleavage still can be provided, and a FFP abnormality attributed to an uneven end surface mirror can be prevented, as compared to that introduced when conventional art is employed.

Figure 3A:
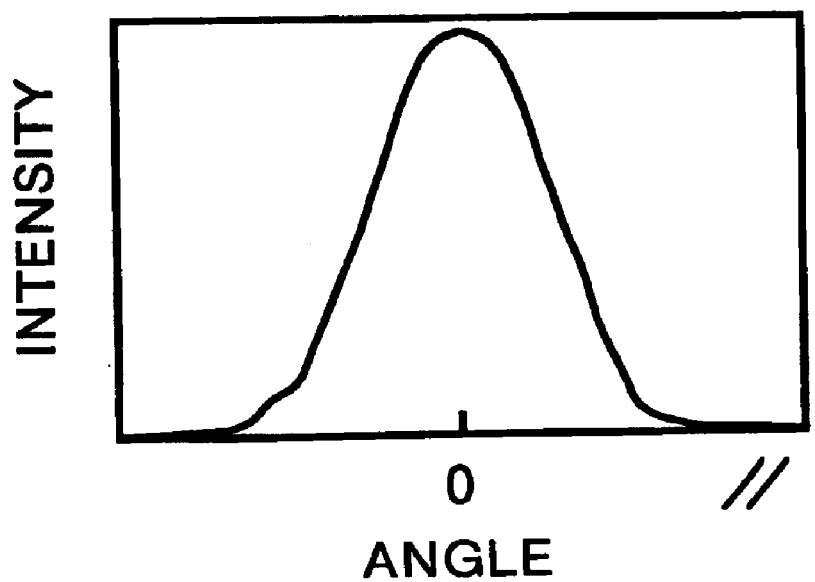
FIG. 3A represents horizontal FFP characteristics of the semiconductor laser device of the present invention and FIG. 3B represents that of a conventional semiconductor laser device.
Figure 3B:
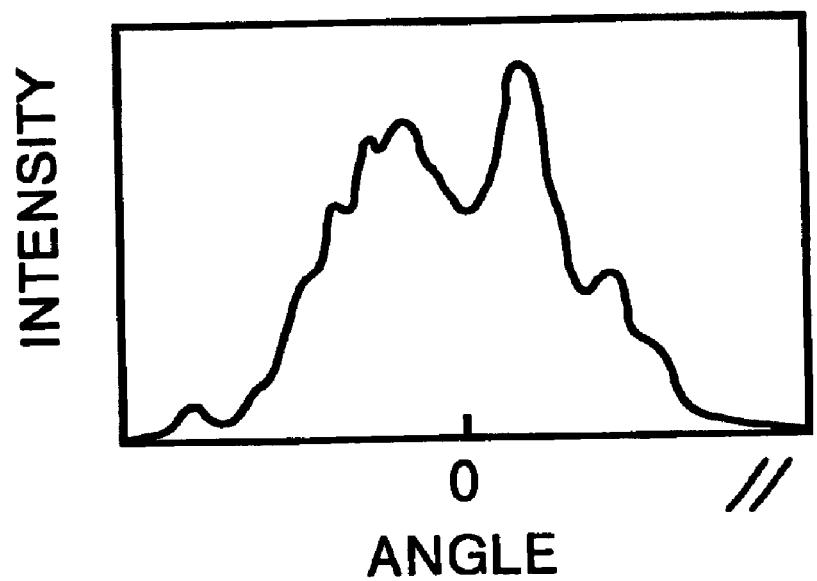
Figure 4:
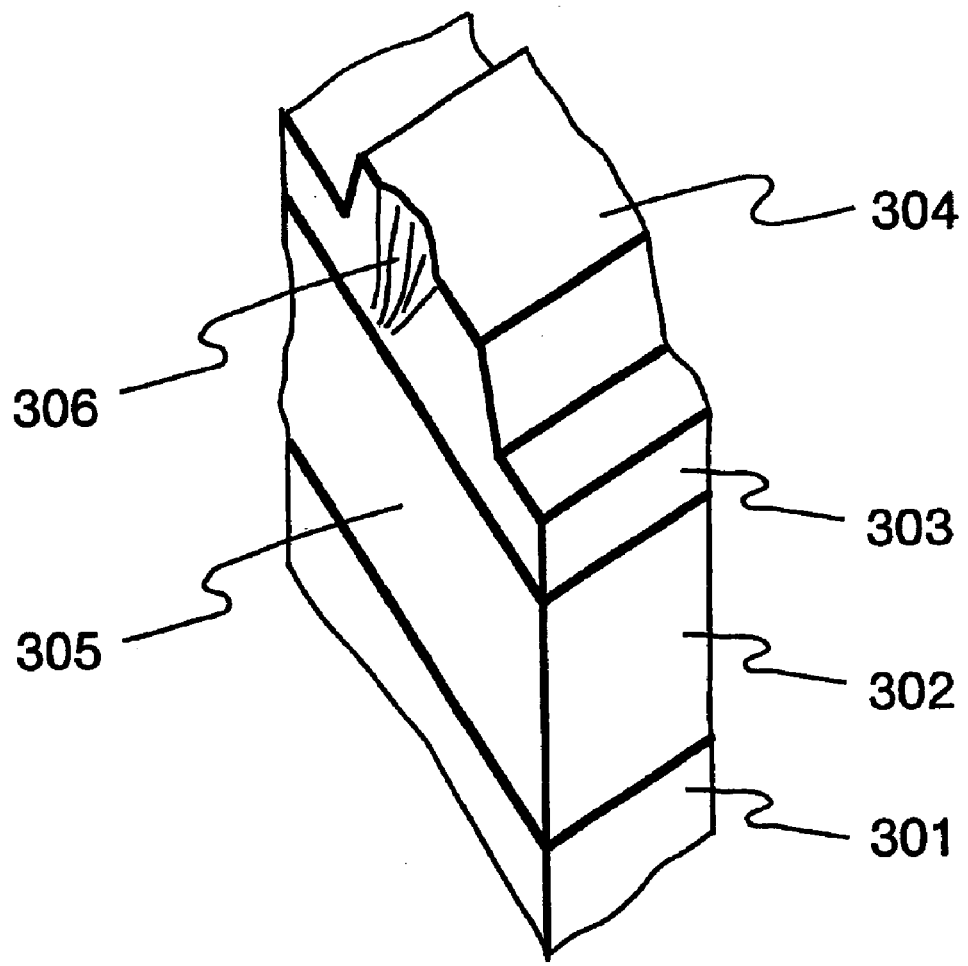
FIG. 4 shows a device for comparison with the semiconductor laser device of the present invention.

FIGS. 3A and 3B represent a FFP in a horizontal direction (a direction parallel to each layer's stacking plane), by way of example. FIG. 3A represents a horizontal FFP of a semiconductor laser device of the present invention and FIG. 3B represents by way of example a horizontal FFP of a comparative device based on conventional art corresponding to the semiconductor laser device of the present embodiment with contact layer 109 of p-$Al_aIn_bGa_{1-a-b}N$ modified to be of p-GaN. The semiconductor laser device of the present embodiment provides a pattern which is unimodal and substantially free of ripple, whereas the comparative device provides a plurality of peeks and thus provides an abnormal pattern. FIG. 4 shows the comparative device providing a defective horizontal FFP, enlarged at an end surface mirror 305. As shown in the figure, on a substrate 301 of n-GaN a stack of layers of n-type semiconductor 302 (a layer corresponding to intermediate layer 102 of n-GaN through lower guide layer 104 of n-GaN), a light emission layer 307 (triple quantum well active layer 105 and cap layer 106 of AlGaN) and a stack of layers of p-type semiconductor 303 (a layer corresponding to upper guide layer 107 of p-GaN through contact layer 109 of p-$Al_aIn_bGa_{1-a-b}N$) are successively provided and the stack of layers 303 is also provided with a ridged stripe 304. For the sake of simplicity the figure does not show the metal electrode or the insulation film. A portion corresponding to the active layer through ridged stripe 304 is not normally cleaved and it thus has an uneven portion 306. Such an uneven end surface mirror of the waveguide portion is believed to introduce an abnormal horizontal FFP.

To clarify this, the semiconductor laser device of the present embodiment is modified to have p-type contact layer 109 having different compositions to provide different lattice constants and the ratio of devices with a normal, horizontal FFP is examined for each lot. It has been found that using a contact layer of p-$Al_aIn_bGa_{1-a-b}N$ with (a, b)=(0, 0.05), (0, 0.2), (0.1, 0.1), (0.2, 0.1) also provides a satisfactory cleavage. Furthermore, various types of crystal were examined with the lattice constant of p-type contact layer 109 noted and it has been found that contact layer 109 having a lattice constant 0.4 to 6% larger than a GaN crystal serving as the substrate results in a satisfactory cleavage. Such a variation in composition of the contact layer is similarly effective when it is applied to the semiconductor laser devices of the second to seventh embodiments described hereinafter. Note that a difference in lattice constant herein refers to a difference of an interval of a crystal plane parallel to each semiconductor layer's stacking plane (or a substrate plane) and it can be measured by X-ray diffraction, electron diffraction or the like.

Second Embodiment

Figure 5:
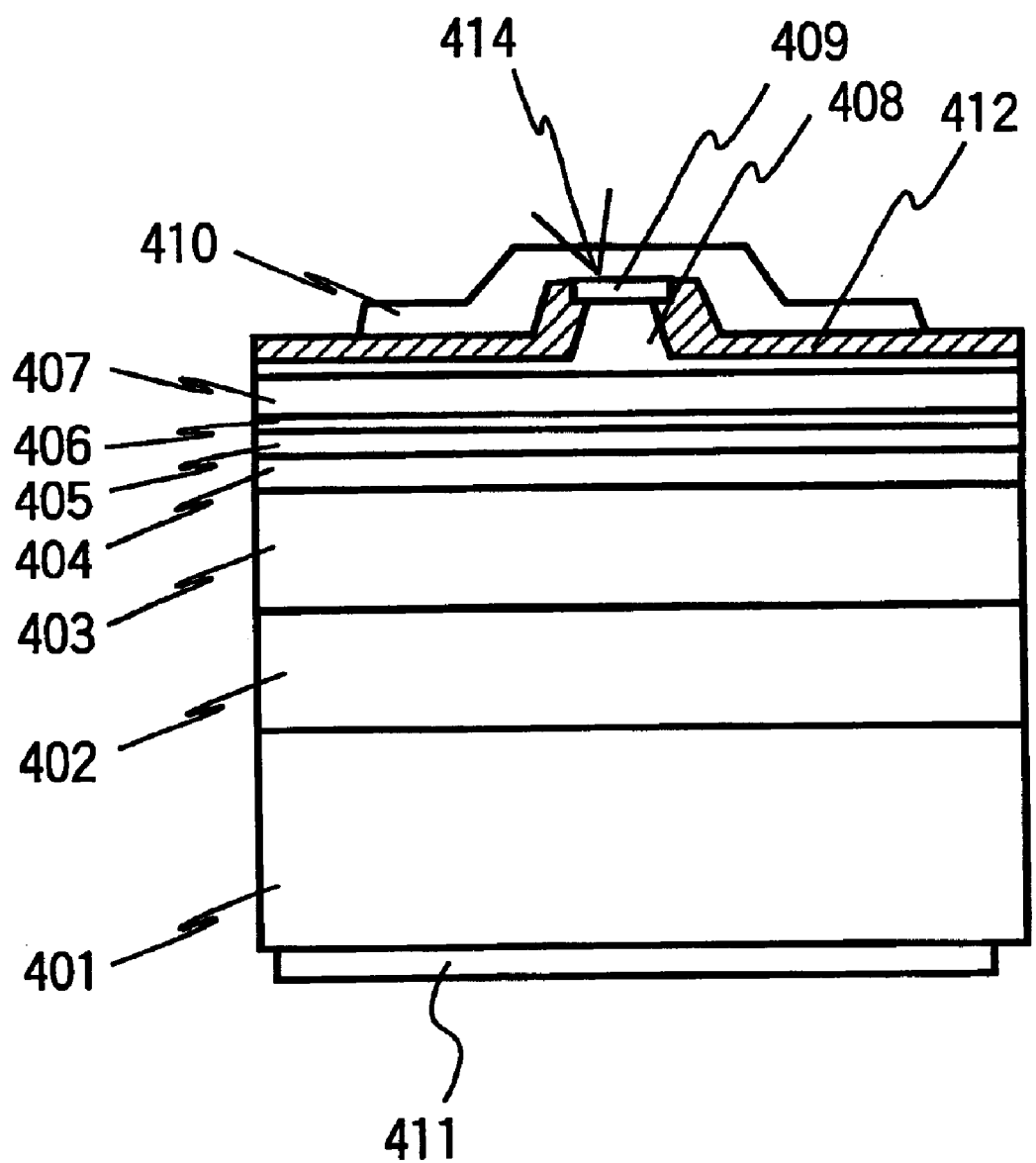
FIG. 5 shows a semiconductor laser device of the present invention.

FIG. 5 is a cross section of a semiconductor laser device of a second embodiment. This semiconductor laser device includes a substrate 401 of n-GaN and 30–200 $\mu$m in thickness, and thereon an intermediate layer 402 of n-GaN and 0–30 $\mu$m in thickness, a lower clad layer 403 of n-$Al_{x1}Ga_{1-x1}N$ and 0.5–10 $\mu$m in thickness, wherein $0.05 \leq x1 \leq 0.2$, a lower guide layer 404 of n-$In_{y1}Ga_{1-y1}N$ and 0–0.3 $\mu$m in thickness, wherein $0 \leq y1 \leq w$, an active layer 405 formed of a well layer of $In_wGa_{1-w}N$, wherein $0 < w < 1$, and a barrier layer of $In_vGa_{1-v}N$, wherein $0 \leq v < w$, alternating to provide a multi-layer structure, and having a light emission wavelength of 370–500 nm and a total thickness of 3–200 nm, a cap layer 406 of p-AlGaN and 0–20 nm in thickness, an upper guide layer 407 of p-$In_{y2}Ga_{1-y2}N$ and 0–0.3 $\mu$m in thickness, wherein $0 \leq y2 < w$, an upper clad layer 408 of p-$Al_{x2}Ga_{1-x2}N$ and 0.4–10 $\mu$m in thickness, wherein $0.05 \leq x1 \leq 0.2$, and a contact layer 409 of p-$Al_aIn_bGa_{1-a-b}N$ and 20 nm to 50 $\mu$m in thickness and having a lattice constant larger than the substrate, wherein a=0.02 and b=0.15, each layer being a nitride based semiconductor layer. Contact layer 409 has an upper surface provided with a metal electrode 410 (for example Pd/Au, Ni/Pd/Au, Pd/Pt/Au, or the like) and substrate 401 has a back surface provided with a metal electrode 411 (for example Ti/Al, Zr/Al, Hf/Al or the like). A portion of upper clad layer 408 and contact layer 409 are ridged to have a striped geometry to provide a semiconductor laser's lateral light confinement configuration. Furthermore, metal electrode 410 contacts the semiconductor layer only at a ridged, striped portion 414 and the remainder thereof is prevented by an interposed insulation film 412 from contacting the semiconductor layer (upper clad layer 408). Thus only ridged, striped portion 414 passes an electric current to also implement a portion narrowing the electric current.

Figure 6:
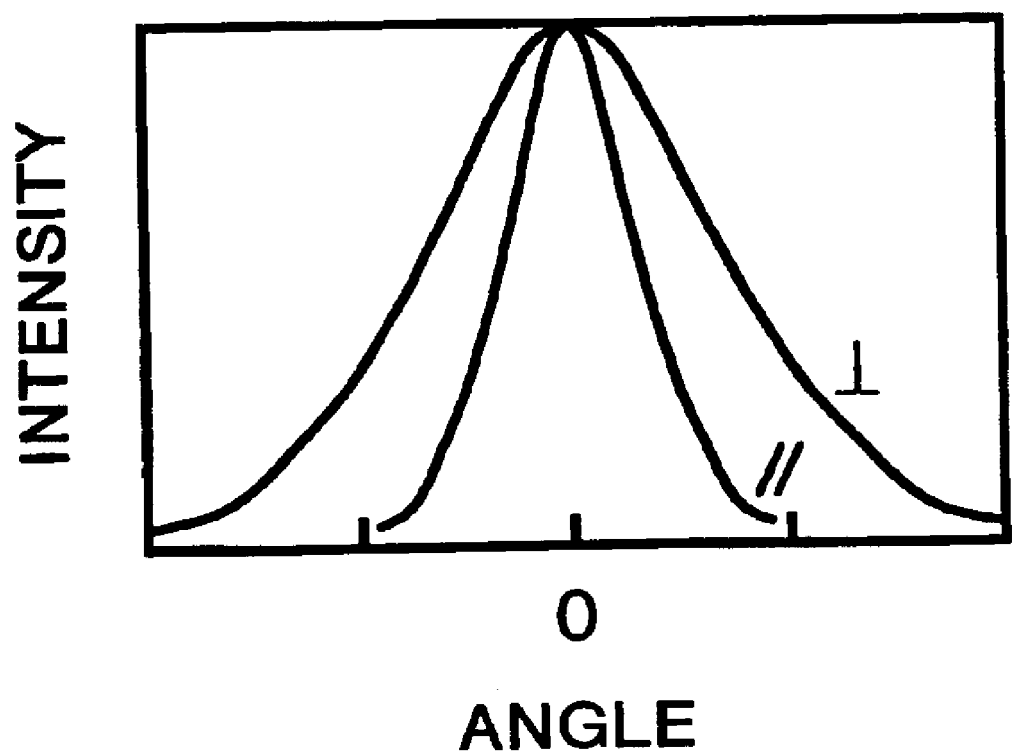
FIG. 6 represents FFP characteristics of the semiconductor laser device of the present invention.

As well as the first embodiment, the present embodiment can also provide satisfactory cleavage and if the p-type contact layer varies in composition there sill can be provided a satisfactory device having a smooth, unimodal FFP in directions orthogonal ($\perp$) and parallel (//) to each layer's stacking plane, as shown in FIG. 6.

As well as the first embodiment, the present embodiment is also capable of a variety of modification and is also as effective as the first embodiment.

Third Embodiment

Figure 7:
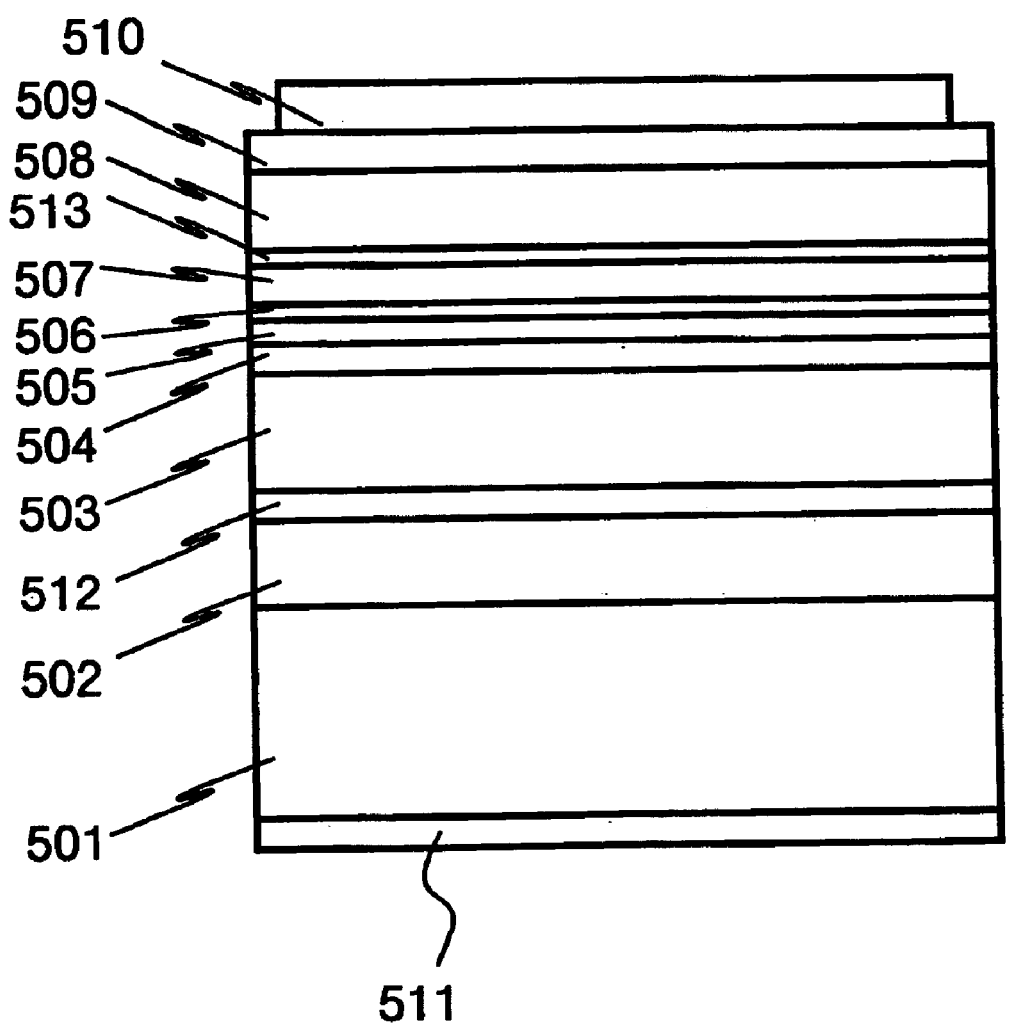
FIGS. 7 and 8 each show a semiconductor laser device of the present invention.

FIG. 7 schematically shows a cross section of the semiconductor laser device of a third embodiment, as seen in a direction of a resonator (or waveguide portion) thereof. The semiconductor laser device has each layer having a thickness and a composition, as follows: a substrate 501 of n-Al$_m$In$_a$Ga$_{1-m-n}$N and 70 μm in thickness, wherein m=0, n=0, and thereon an intermediate layer 502 of n-GaN and 4 μm in thickness, an intermediate layer 512 of n-In$_c$Ga$_{1-c}$N and 0.05 μm in thickness, wherein c=0.07, a lower clad layer 503 of n-Al$_{x1}$Ga$_{1-x1}$N and 0.7 μm in thickness, wherein x1=0.1, a lower guide layer 504 of n-In$_{y1}$Ga$_{1-y1}$N and 0.1 μm in thickness, wherein y1=0.035, a quintuple quantum well active layer 505 formed of a well layer of In$_w$Ga$_{1-w}$N and 4 nm in thickness, wherein w=0.17, and a barrier layer of In$_v$Ga$_{1-v}$N and 8 nm in thickness, wherein v=0.05, alternately stacked to provide a multi-layer structure (formed of a barrier layer/a well layer/a barrier layer/a well layer/a barrier layer), having a light emission wave length of 410 nm and a total thickness of 68 nm, a cap layer 506 of p-Al$_z$Ga$_{1-z}$N and 30 nm in thickness, wherein z=0.2, an upper guide layer 507 of p-In$_{y2}$Ga$_{1-y2}$N and 0.1 μm in thickness, wherein y2=0.035, a saturable absorption layer 513 of p-In$_p$Ga$_{1-p}$N and 5 nm in thickness, wherein p=0.17, an upper clad layer 508 of p-Al$_{x2}$Ga$_{1-x2}$N and 0.5 μm in thickness, wherein x2=0.1, and a contact layer 509 of p-Al$_a$In$_b$Ga$_{1-a-b}$N and 100 nm in thickness and having a lattice constant larger than the substrate, wherein a=0, b=0.15, successively stacked on the substrate. Furthermore, contact layer 509 has an upper surface provided with a metal electrode 510 (for example of Pd/Au, Ni/Pd/Au, Pd/Pt/Au) and the substrate has a back surface provided with a metal electrode 511 (for example of Ti/Al, Zr/Al, Hf/Al). In the present embodiment the semiconductor laser device has metal electrode 510 failing to reach an end surface mirror and consequently having a length shorter than a resonator. This is devised to eliminate difficulty in providing a cleavage; in forming an end surface mirror from a wafer though cleavage, a metal electrode contiguous at the position of the cleavage would render it difficult to provide the cleavage. While in the present embodiment metal electrode 511 closer to the substrate is provided in a vicinity of an end surface mirror, it is similarly effective that as well as metal electrode 510 closer to the grown layers, metal electrode 511 is not provided in a vicinity of an end surface mirror. The semiconductor laser devices of the other embodiments with the metal electrode not in a vicinity of an end surface mirror are also similarly effective and preferable.

As well as the first embodiment, the present embodiment can also provide satisfactory cleavage and if contact layer 509 varies in composition there still can be provided a satisfactory device having a smooth and unimodal FFP in directions orthogonal (⊥) and parallel (//) to each layer's stacking plane, as represented in FIG. 6. Note that at room temperature, a lasing threshold of 55 mA was provided and even at 80° C. a continuous lasing operation was still observed.

As well as the first embodiment, the present embodiment is also capable of a variety of modification and can also be as effective as the first embodiment.

Fourth Embodiment

The fourth embodiment is identical to the second embodiment except that upper and lower clad layers 503 and 508 and active layer 505 of the semiconductor laser device of the third embodiment vary in composition and configuration, respectively. In the present embodiment the semiconductor laser device has an active layer configured of a triple quantum well active layer formed of a well layer of In$_w$Ga$_{1-w}$N and 5 nm in thickness, wherein w=0.17, and a barrier layer of In$_v$Ga$_{1-v}$N and 10 nm in thickness, wherein v=0.05, alternately arranged to provide a multi-layer structure (formed of a barrier layer/a well layer/a barrier layer), and having a light emission wavelength of 410 nm and a total thickness of 55 nm. The semiconductor laser device also has clad layers configured of a lower clad layer (having a total thickness of 1.5 μm) formed of a Si doped, thin film of Al$_{0.2}$Ga$_{0.8}$N and 3 to 20 nm in thickness and a Si doped, thin film of GaN and 3 to 20 nm in thickness alternately stacked to provide a superlattice clad, and an upper clad layer (having a total thickness of 0.7 μm) formed of a Mg doped, thin film of Al$_{0.2}$Ga$_{0.8}$N and 3 to 20 nm in thickness and a Si doped, thin film of GaN and 3 to 20 nm in thickness alternately stacked and providing a superlattice clad, and an upper clad layer (having a total thickness of 0.7 μm) formed of a Mg doped, thin film of Al$_{0.2}$Ga$_{0.8}$N and 3 to 20 nm in thickness and a Mg doped, thin film of GaN and 3 to 20 nm in thickness alternately stacked and providing a superlattice clad.

As well as the first embodiment, the present embodiment can also provide satisfactory cleavage and if the p-type contact layer varies in composition there still can be provided a satisfactory device having a smooth, unimodal FFP in directions orthogonal (⊥) and parallel (//) to each layer's stacking plane, as represented in FIG. 6. Note that at room temperature, a lasing threshold of 25 mA was provided and even at 110° C. a continuous lasing operation was still observed.

As well as the first embodiment, the present embodiment is also capable of a variety of modification and can also be as effective as the first embodiment.

Fifth Embodiment

A fifth embodiment provides a semiconductor laser device, as schematically shown in FIG. 7. This semiconductor laser device has each layer having a thickness and a composition, as follows: a substrate 501 of n-Al$_m$In$_n$Ga$_{1-m-n}$N and 30 to 200 μm in thickness, wherein 0≦m, 0≦n<1, m+n≦1, and thereon an intermediate layer 502 of n-Al$_i$Ga$_{1-i}$N and 0 to 30 μm in thickness, wherein 0≦i≦0.2, an intermediate layer 512 of n-In$_c$Ga$_{1-c}$N and 0 to 0.2 μm in thickness, wherein 0≦c≦0.2, a lower clad layer 503 of n-Al$_{x1}$Ga$_{1-x1}$N and 0.4 to 10 μm in thickness, wherein 0.05≦x1≦0.3, a lower guide layer 504 of In$_{y1}$Ga$_{1-y1}$N and 0 to 0.3 μm in thickness, wherein 0≦y1≦w, a quantum well active layer 505 formed of a well layer of In$_w$Ga$_{1-w}$N and a barrier layer of In$_v$Ga$_{1-v}$N alternately provided to provide a multi-layer structure, wherein v<w, and having a light emission wavelength of 370 to 450 nm and a total thickness of 3 to 200 nm, a cap layer 506 of Al$_z$Ga$_{1-z}$N and 0 to 50 nm in thickness, wherein 0≦z≦0.3, an upper guide layer 507 of In$_{y2}$Ga$_{1-y2}$N and 0 to 0.3 μm in thickness, wherein 0≦y2≦w, a saturable absorption layer 513 of p-InGaN and 0 to 50 nm in thickness, an upper clad layer 508 of p-Al$_{x2}$Ga$_{1-x2}$N and 0.4 to 10 μm in thickness, wherein 0.05≦x2≦0.2, and a contact layer 509 of p-Al$_a$In$_b$Ga$_{1-a-b}$N and 20 nm to 50 μm in thickness, wherein 0≦a<1, 0≦b, a+b≦1, having a lattice constant larger than the substrate's crystal, preferably 0.4 to 6% larger than the crystalline substrate. A wafer, as measured from substrate 501 through the overlying contact layer 509, measures 50 to 200 μm. Furthermore, contact layer 509 has an upper surface provided with an electrode 510 (of a metal for example containing any of Co, Ni, Cu, Pd, Ag, Ir, Pt, Au, Sc, Ti, V, Cr, Y, Zr, Nb, Mo, La, Hf, Ta, W, Al, Tl) and substrate 501 has a back surface provided with an electrode 511 (of a metal for example containing any of Co, Ni, Cu, Pd, Ag, Ir, Pt, Au, Sc, Ti, V, Cr, Y, Zr, Nb, Mo, La, Hf, Ta, W, Al, Tl). Although not shown in the figure, the present semiconductor laser device has a flat laser resonator mirror provided by a surface of the device that is provided by cleaving a semiconductor crystal and thus dividing the device.

As well as the first embodiment, the present embodiment can also provide satisfactory cleavage and if the p-type contact layer varies in composition there still can be provided a satisfactory device having a smooth, unimodal FFP in directions orthogonal (⊥) and parallel (//) to each layer's stacking plane, as represented in FIG. 6. The present embodiment can thus provide a semiconductor laser device having superior optical characteristics.

As well as the first embodiment, the present embodiment is also capable of a variety of modification and can also be as effective as the first embodiment. Furthermore, the upper or lower clad may be a superlattice clad, as described in the fourth embodiment.

While the present embodiment has been described to use upper and lower guide layers 504 and 507 of InGaN, the present invention is not limited thereto and they may be of a material having added thereto an element other than In that provides an increased index of refraction when the element is added to GaN, such as As, P, Tl. More specifically, the guide layer may for example be GaNAs, GaNP, GaNPAs, InGaNAs, InGaNP, InGaNPAs, TlGaN, TlInGaN.

Sixth Embodiment

Figure 8:
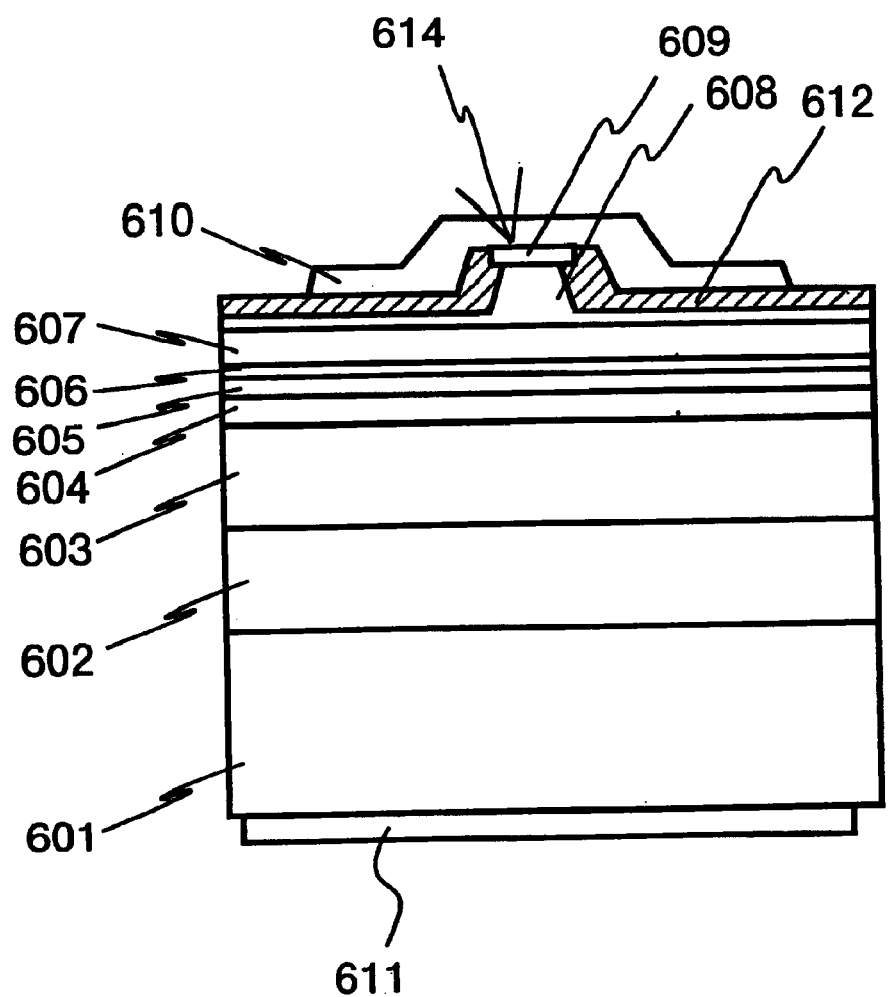

FIG. 8 is a cross section of the semiconductor laser device of a sixth embodiment. This semiconductor laser device is formed of a substrate 601 of n-$Al_m In_n Ga_{1-m-n}N$ and 30 to 200 $\mu$m in thickness, wherein $0 \leq m$, $0 \leq n < 1$, $m+n \leq 1$, and thereon an intermediate layer 602 of n-AlGaInPAs and 0 to 30 $\mu$m in thickness, a lower clad layer 603 of n-AlGaInNPAs with an energy bandgap $E_a[eV]$ and 0.4 to 10 $\mu$m in thickness, a lower guide layer 604 of AlGaInNPAs with an energy bandgap of $E_1[eV]$, wherein $E_1 < E_a$, and 0 to 0.3 $\mu$m in thickness, a quantum well active layer 605 formed of well and barrier layers of AlGaInNPAs alternately provided to provide a multi-layer structure, having a light emission wavelength of 300 to 800 nm and a total thickness of 3 to 200 nm, a cap layer 606 of AlGaInNPAs with an energy bandgap $E_c[eV]$, wherein $E_c > E_2$, and 0 to 100 nm in thickness, an upper guide layer 607 of AlGaInNPAs with an energy bandgap $E_2[eV]$, wherein $E_2 < E_b$, and 0 to 0.3 $\mu$m in thickness, an upper clad layer 608 of p-AlGaInNPAs with an energy bandgap $Eb[eV]$ and 0.3 to 10 $\mu$m in thickness, and a contact layer 609 of p-$Al_a In_b Ga_{1-a-b}N$, wherein $0 \leq a < 1$, $0 \leq b$, $a+b \leq 1$, and 5 nm to 50 $\mu$m in thickness and having a lattice constant larger than the substrate's crystal. A wafer, as measured from substrate 601 through the overlying contact layer 609, measures 50 to 200 $\mu$m. Furthermore, contact layer 609 has an upper surface provided with an electrode 610 (of a metal for example containing any of Co, Ni, Cu, Pd, Ag, Ir, Pt, Au, Sc, Ti, V, Cr, Y, Zr, Nb, Mo, La, Hf, Ta, W, Al, Tl) and substrate 601 has a back surface provided with an electrode 611 (of a metal for example containing any of Co, Ni, Cu, Pd, Ag, Ir, Pt, Au, Sc, Ti, V, Cr, Y, Zr, Nb, Mo, La, Hf, Ta, W, Al, Tl). Although not shown in the figure, the present semiconductor laser device has a flat laser resonator mirror provided by a surface of the device that is provided by cleaving a semiconductor crystal and thus dividing the device. A portion of upper clad layer 608 and contact layer 609 are ridged to have a striped geometry to provide a semiconductor laser's lateral light confinement configuration. Furthermore, metal electrode 610 contacts the semiconductor layer only at the ridged, striped portion 614 and the remainder thereof is prevented by an interposed insulation film 612 from contacting the semiconductor layer (upper clad layer 608). Thus only the ridged, striped portion passes an electric current to also implement a portion narrowing the electric current. The active layer's composition can be set to provide to a light emission wavelength.

The semiconductor laser device of the present embodiment is fabricated, as described in the first embodiment.

As well as the first embodiment, the present embodiment can also provide satisfactory cleavage and if p-type contact layer 609 varies in composition there still can be provided a satisfactory device having a smooth, unimodal FFP in directions orthogonal (⊥) and parallel (//) to each layer's stacking plane, as represented in FIG. 6.

As well as the first embodiment, the present embodiment is also capable of a variety of modification and can also be as effective as the first embodiment. Furthermore, the upper or lower clad may be a superlattice clad, as described in the fourth embodiment.

Seventh Embodiment

Figure 9:
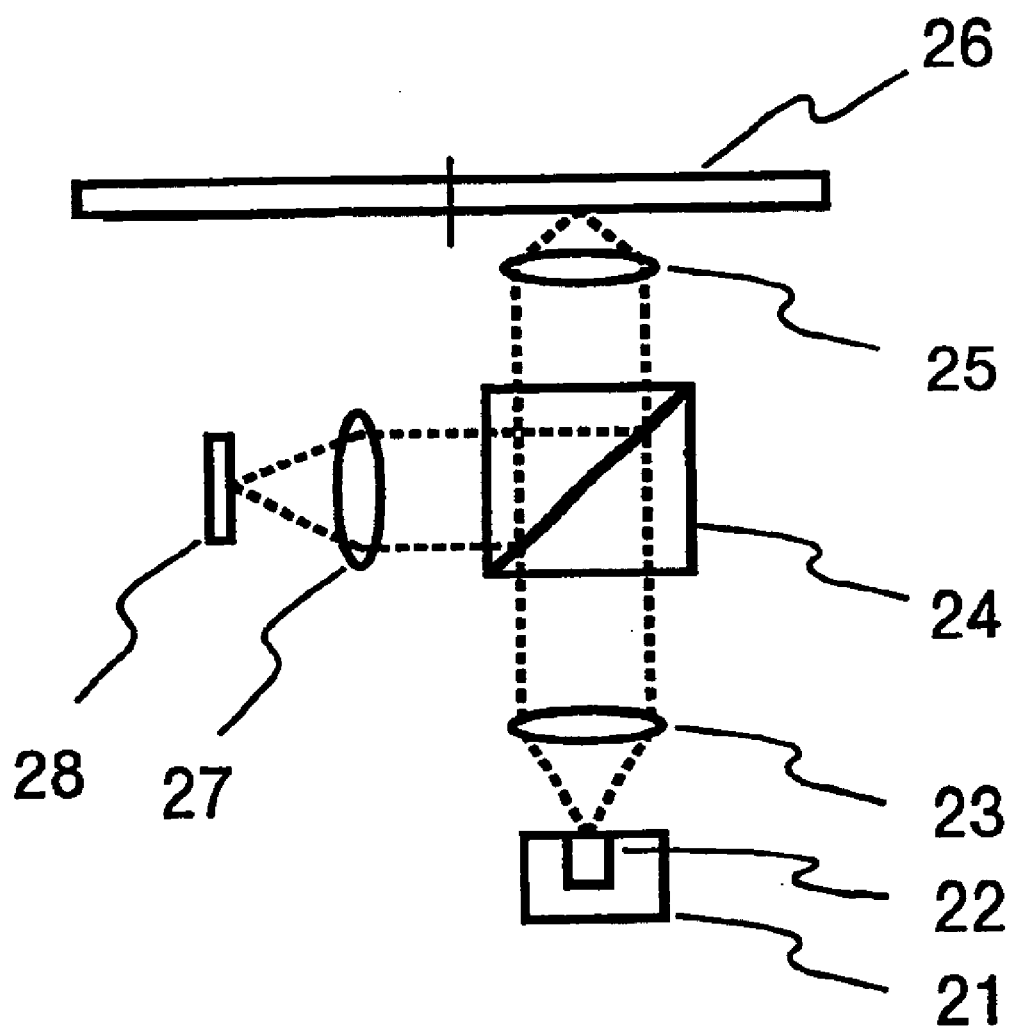
FIG. 9 shows an optical information reproduction apparatus of the present invention.
Figure 10:
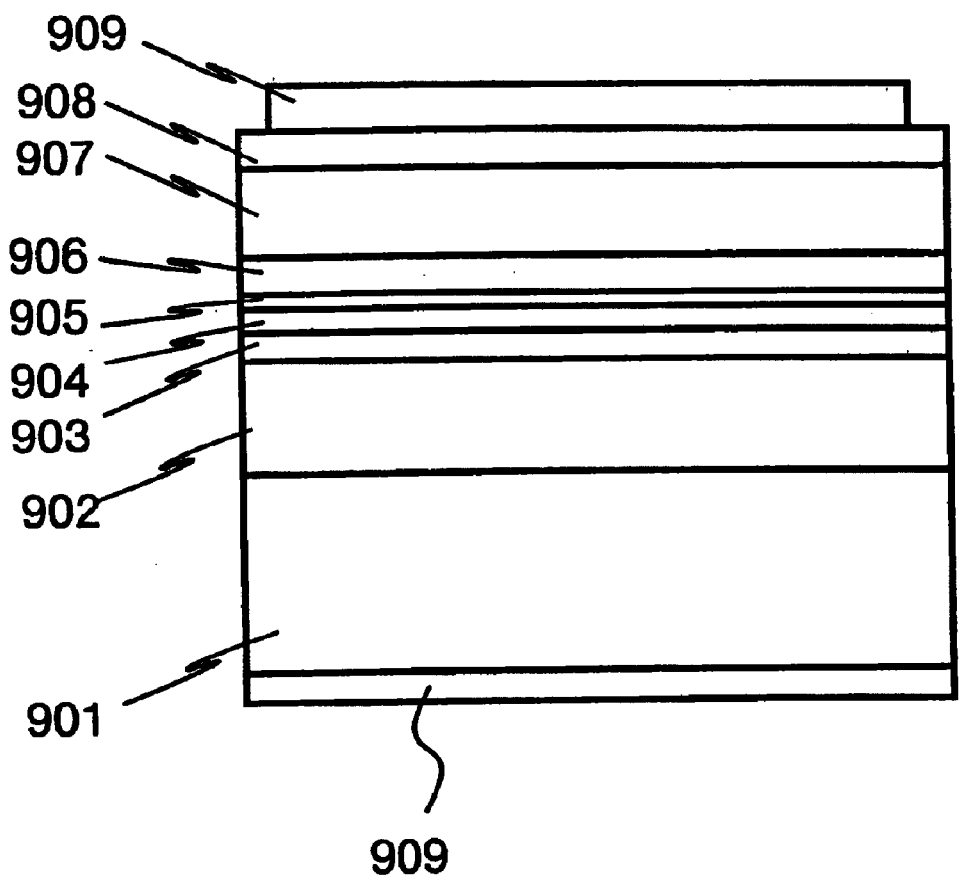
FIG. 10 shows a conventional semiconductor laser device.

FIG. 9 shows a concept of an optical information reproduction apparatus of the present embodiment. The present apparatus is formed of a base 21, a semiconductor laser device 22, as described in the first embodiment, provided on base 21, a collimator lens 23, a beam splitter 24, an objective lens 25, a lens 27 serving to condense a reflection of light, and a photodetector 28 detecting condensed light. In the optical information reproduction apparatus of the present embodiment at a position at which the objective lens condenses light an optical information recording medium 26 is set in the form of a disk (or an optical disk). In this apparatus, semiconductor laser device 22 serving as a source of light outputs a laser beam of light which is in turn collimated or substantially collimated by collimator lens 23 and then transmitted through beam splitter 24 and then condensed by objective lens 25 to illuminate an information recording surface of optical disk 26. The information recording surface of optical disk 26 is provided with protrusions and depressions or is modulated magnetically or in index of refraction to write bit information therein. A laser beam of light that is condensed is reflected thereby and then transmitted through objective lens 25 and then branched by beam splitter 24 and condensed by lens 27 on photodetector 28 to convert an optically detected signal to an electrical signal to read and reproduce recorded information.

In the present embodiment the optical information reproduction apparatus uses a semiconductor laser device free of significant FFP ripple and thus having satisfactory optical characteristics and objective lens 25 can thus condense light on the information recording surface of optical disk 26 with high resolution and as a result information written in an optical disk with as high a density as 5 M/$mm^2$ can be read at a bit error rate of $10^{-6}$. By contrast, the conventional art referred to in connection with the first embodiment was used to provide a semiconductor laser device and the semiconductor laser device was used in place of the FIG. 9 semiconductor laser device 21, and under a similar condition there were found a large number thereof practically unsuitable for practical application for a bit error rate of approximately $10^{-3}$. The optical information reproduction apparatus of the present embodiment can thus read information densely recorded in an optical disk at a low error rate and it was thus confirmed that the apparatus allows light to be condensed on an optical disk with high resolution.

Furthermore in the optical information reproduction apparatus of the present embodiment semiconductor laser device 21 is substituted with that of any of the second to six embodiments. It was found that in any case, under the above-described condition a bit error rate of $10^{-6}$ to $10^{-8}$ is achieved and light can be condensed on an optical disk with high resolution.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a crystal lattice constant larger than a crystal lattice constant of said substrate of nitride semiconductor, wherein in said layers stacked on said substrate a waveguide in a stripe is provided, said substrate and said layers on said substrate are cleft along a plane perpendicular to a direction of said stripe in which said waveguide is provided, and along a plane parallel to a (10—10) plane of said substrate, to provide an end surface acting as a resonator mirror at an end of said waveguide.

2. The semiconductor laser device of claim 1, wherein said contact layer of $Al_aIn_bGa_{1-a-b}N$ is larger in crystal lattice constant than said substrate of nitride semiconductor by 0.4 to 6%.

3. The semiconductor laser device of claim 1, wherein said substrate of nitride semiconductor is formed of GaN and said contact layer of $Al_aIn_bGa_{1-a-b}N$ has a composition with a=0 and $0.05 \leq b \leq 0.3$.

4. The semiconductor laser device of claim 1, wherein said contact layer of $Al_aIn_bGa_{1-a-b}N$ is not less than 20 nm in thickness.

5. The semiconductor laser device of claim 1, having a thickness of 50 to 200 $\mu$m, as measured from said substrate of nitride semiconductor to said contact layer of $Al_aIn_bGa_{1-a-b}N$.

6. A method of fabricating a semiconductor laser device including a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a crystal lattice constant larger than a crystal lattice constant of said substrate of nitride semiconductor, the method comprising the steps of:

forming in said layers of a wafer a waveguide in a stripe;

providing a groove on a surface of said stacked layers of said wafer, said groove being perpendicular to said direction of said stripe of said waveguide and being parallel to the (10—10) plane of said substrate; and externally exerting a force to warp said wafer to allow a grooved side thereof to protrude to cleave said substrate and said layers on said substrate along said groove.

7. An optical information reproduction apparatus including means outputting a laser beam of light from a semiconductor laser device, means condensing the output laser beam of light to illuminate an optical information recording medium therewith, means receiving a reflection of light from said illuminated optical information recording medium and condensing the reflection of light to illuminate a photodetector therewith, and means detecting a light reflected from said illuminated optical information recording medium for reproduction to reproduce information recorded on said optical information recording medium, said semiconductor laser device including a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a crystal lattice constant larger than a crystal lattice constant of said substrate of nitride semiconductor, wherein in said layers stacked on said substrate a waveguide in a stripe is provided, said substrate and said layers on said substrate are cleft along a plane perpendicular to a direction of said stripe of said waveguide and along a plane parallel to the (10—10) plane of said substrate, to provide an end surface acting as a resonator mirror at an end of said waveguide.

8. A semiconductor laser device comprising a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon, wherein:

said substrate of nitride semiconductor is formed of GaN;

said contact layer of $Al_aIn_bGa_{1-a-b}N$ has a composition with a=0, and $0.05 \leq b \leq 0 3$; and in said layers stacked on said substrate a waveguide in a stripe is provide, said substrate and said layers on said substrate are cleft along a plane perpendicular to a direction of said stripe of said waveguide and along a plane parallel to the (10—10) plane of said substrate to provide an end surface acting as a resonator mirror at an end of said waveguide.

9. A method of fabricating a semiconductor laser device including a substrate of nitride semiconductor, a lower clad layer of nitride semiconductor stacked thereon, an active layer stacked thereon, an upper clad layer of nitride semiconductor stacked thereon, and a contact layer of $Al_aIn_bGa_{1-a-b}N$ stacked thereon and having a crystal lattice constant larger than a crystal lattice constant of said substrate of nitride semiconductor, the method comprising the steps of:

forming in said layers of a wafer a waveguide in a stripe;

providing a groove on a surface of said substrate of said wafer, said groove being perpendicular to said direction of said stripe of said waveguide and being parallel to the (10—10) plane of said substrate; and externally exerting a force to warp said wafer to allow a grooved side thereof to protrude to cleave said substrate and said layers on said substrate along said groove.

* * * * *